United States Patent
Pierson et al.

(10) Patent No.: US 6,560,727 B1
(45) Date of Patent: May 6, 2003

(54) BIT ERROR RATE TESTER USING FAST PARALLEL GENERATION OF LINEAR RECURRING SEQUENCES

(75) Inventors: Lyndon G. Pierson, Albuquerque, NM (US); Edward L. Witzke, Edgewood, NM (US); Joseph H. Maestas, Bosque Farms, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 09/426,073

(22) Filed: Oct. 21, 1999

(51) Int. Cl.$^7$ .................................................. G06F 11/00

(52) U.S. Cl. ........................................................ 714/704

(58) Field of Search .................................. 714/704, 705, 714/707

(56) References Cited

U.S. PATENT DOCUMENTS

| | | | | |
|---|---|---|---|---|
| 5,383,143 A | * | 1/1995 | Crouch et al. | 708/254 |
| 5,446,683 A | * | 8/1995 | Mullen et al. | 708/256 |
| 5,726,991 A | * | 3/1998 | Chen et al. | 714/704 |
| 5,910,907 A | * | 6/1999 | Chen et al. | 380/265 |
| 6,038,577 A | * | 3/2000 | Burshtein | 708/252 |

OTHER PUBLICATIONS

Tarman, et al, *Algorithm–Agile Encryption in Asychrononous Transfer Mode Networks*, Abstract., pp. 1–12.

Institute of Electrical & Electronics Engineers, Conference Proceedings of the 1996 IEEE Fifteenth Annual International Phoenix Conference on Computers and Communications, Mar. 27–29, 1996.

* cited by examiner

*Primary Examiner*—Christine T. Tu
*Assistant Examiner*—Esaw Abraham
(74) *Attorney, Agent, or Firm*—George H. Libman

(57) ABSTRACT

A fast method for generating linear recurring sequences by parallel linear recurring sequence generators (LRSGs) with a feedback circuit optimized to balance minimum propagation delay against maximal sequence period. Parallel generation of linear recurring sequences requires decimating the sequence (creating small contiguous sections of the sequence in each LRSG). A companion matrix form is selected depending on whether the LFSR is right-shifting or left-shifting. The companion matrix is completed by selecting a primitive irreducible polynomial with 1's most closely grouped in a corner of the companion matrix. A decimation matrix is created by raising the companion matrix to the $(n*k)^{th}$ power, where k is the number of parallel LRSGs and n is the number of bits to be generated at a time by each LRSG. Companion matrices with 1's closely grouped in a corner will yield sparse decimation matrices. A feedback circuit comprised of XOR logic gates implements the decimation matrix in hardware. Sparse decimation matrices can be implemented with minimum number of XOR gates, and therefore a minimum propagation delay through the feedback circuit. The LRSG of the invention is particularly well suited to use as a bit error rate tester on high speed communication lines because it permits the receiver to synchronize to the transmitted pattern within 2n bits.

6 Claims, 6 Drawing Sheets

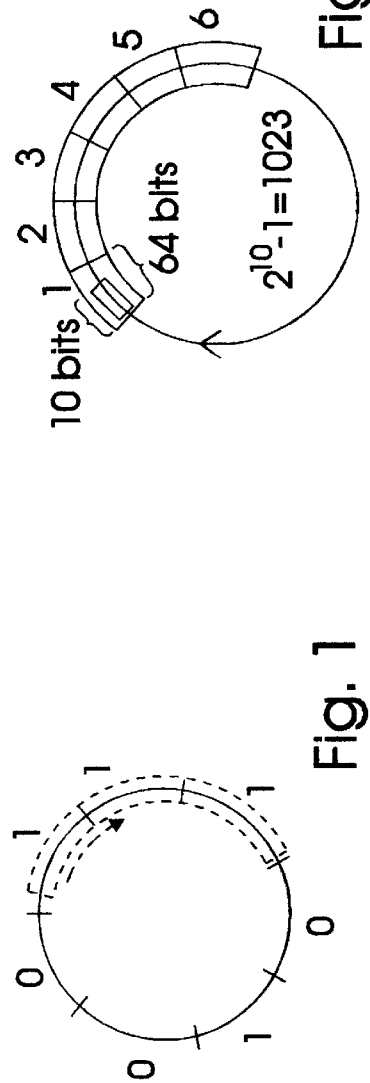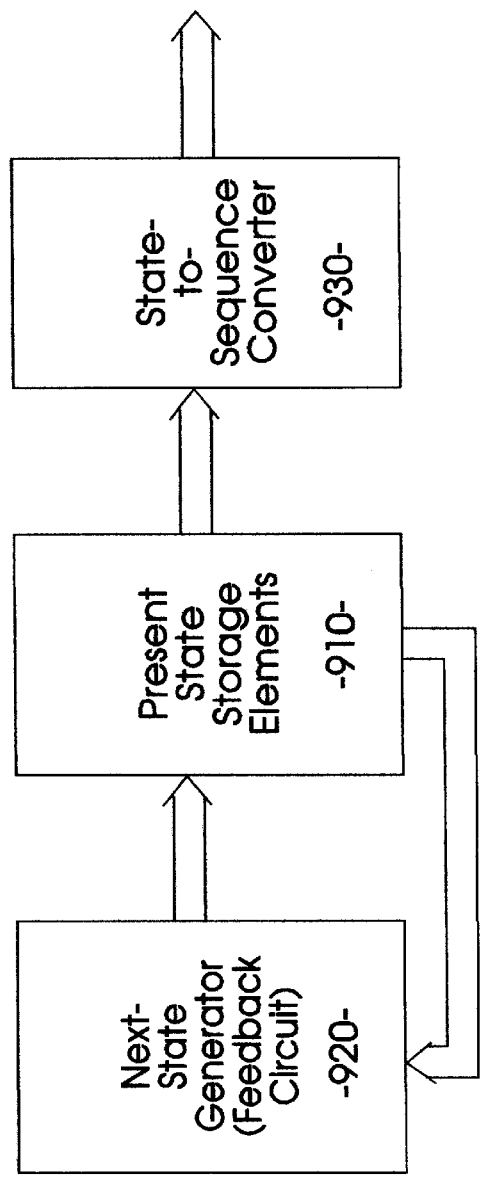

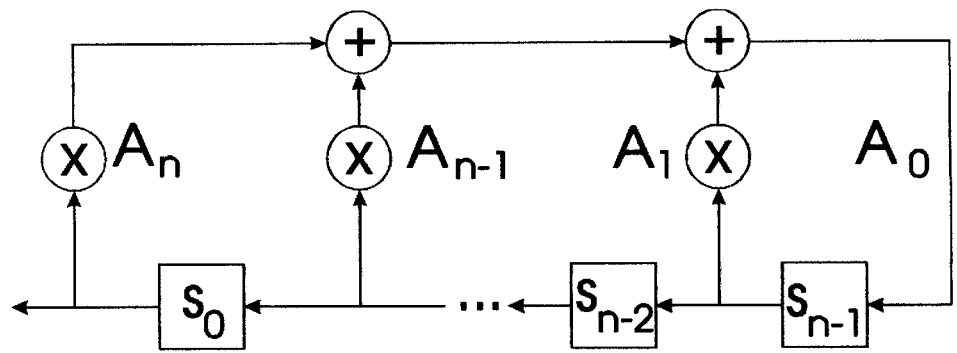
Fig. 2    (Prior Art)
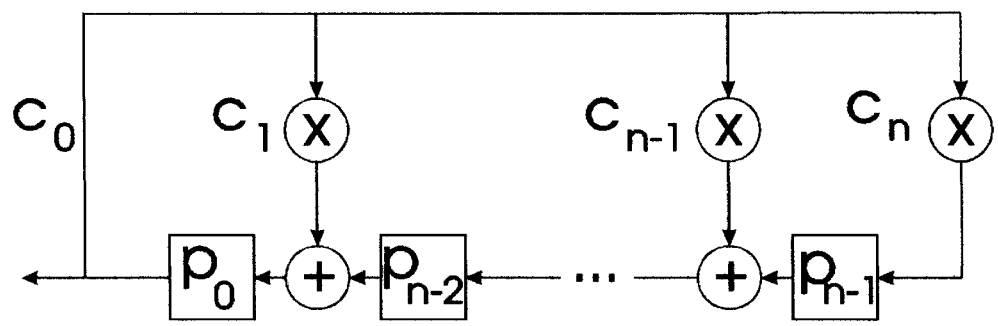
Fig. 3    (Prior Art)

BIT ERROR RATE TESTER USING FAST PARALLEL GENERATION OF LINEAR RECURRING SEQUENCES

The U.S. Government has rights in this invention as provided for by the terms of DE-AC04-94AL85000 awarded by the Department of Energy.

BACKGROUND OF THE INVENTION

1. Field of the Invention

This invention relates to generation of linear recurring sequences and the utilization of such sequences.

2. Relevant Background

Definitions

Asynchronous Transfer Mode (ATM): a communications protocol with a 384 bit data frame (payload) size.

Bit Error Rate Test (BERT) equipment: tests for errors by outputting a long stream of pseudorandom bits onto the communication line. The communication line is looped back to the BERT so that the same bits that it sends out should return to it. The BERT then compares the return bits to find any bits that are altered while they traveled over the communication line.

Characteristic Polynomial: usually associated with the Galois form of LFSR. Inverse of the feedback polynomial.

Companion matrices: a linear algebraic characterization of an LFSR function that allows manipulation of linear feedback shift registers using matrix arithmetic.

Decimate: to replace an integer sequence, $S=\{S_1, S_2, S_3, \ldots, S_{2^n-1}\}$, with the sequence $S_k=\{S_{k1}, S_{2k(mod\ 2^n)}, S_{3k(mod\ 2^n)}, S_{4k(mod\ 2^n)}, \ldots, S_{k(2^n-1)(mod\ 2^n)}\}$, thereby producing a sequence of every $K^{th}$ element of the main sequence S. When all the decimations of a sequence are combined in proper order, the original sequence S can be reconstructed. If the decimations are in parallel, the amount of time it takes to generate S is reduced by a factor of k.

Decimation Matrix: is a companion matrix raised to a power k, corresponding to a "jump" in the number of states spanned by each multiplication mod 2 of the companion matrix.

Feedback Polynomial: inverse of characteristic polynomial. Usually associated with the Fibonacci form of LFSR.

Irreducible Polynomial: is a polynomial that cannot be expressed as the product of two other polynomials except for 1 and itself.

Linear Feedback Shift Register (LFSR): a type of shift register incorporating linear feedback of the present contents of the register to determine future contents of the register.

Linear Recurring Sequences (LRS): are pseudorandom sequences of digits derived from linear difference equations. A binary LRS is a sequence of 1's and 0's.

Linear Recurring Sequence Generator (LRSG): incorporates at least one linear feedback shift register or equivalent circuitry to produce a linear recurring sequence.

Modulo 2 (mod 2) arithmetic: is base two arithmetic where a=b(mod 2) if a=b-kn for k=some integer and n=2. Mod 2 addition can be represented in hardware by the XOR function; Mod 2 multiplication can be represented in hardware by the AND function.

Period: The period of a linear recurring sequence is the number of digits before the sequence begins to repeat itself.

Primitive Polynomial: is an irreducible polynomial that divides $x^{2^n-1}+1$ but not $x^d+1$ for any d that divides $2^n-1$.

Pseudonoise Generator: outputs a pseudonoise signal. For digital spread spectrum communications, the pseudonoise signal is a pseudorandom sequence of 1's and 0's (in other words, the output of a binary LRS).

Pseudonoise Signal: is noise that appears to be random but is not truly random.

Pseudorandom Sequence: a sequence of numbers that appears to be random when viewed over a limited range but is not truly random. At some point, the sequence will repeat itself.

Stream Ciphers: a type of cipher that encrypts a message one bit at a time.

Linear Recurring Sequences

A linear recurring sequence is a pseudorandom sequence of length L with the property that every n successive bits (n<L) appears only once in the sequence. For example, the sequence 0111010, which is discussed in detail hereinafter, is an LRS for $n \geq 3$. It is not a LRS for n=2, as the 2 bit sequence "11" appears as both the second and third bits and the third and fourth bits.

FIG. 1 shows a circular representation of the aforementioned LRS. Every combination of bits covered by the 3 bit window is unique. This circular model is useful because it emphasizes that an LRS is a pseudorandom sequence and at some point will begin to repeat itself. If a linear feedback shift register (discussed below), or its equivalent, ever becomes loaded entirely with zeros, it will only output zeros.

Many applications require the ultra-fast generation of an LRS which does not repeat for a long time. One such application is in Bit Error Rate Test (BERT) equipment for testing error statistics of communication lines. Another use is in communications encryption. For example, a linear recurring sequence can be used to feed a nonlinear encryption function, creating a keystream which is used to encrypt plaintext. An LRS is also conventionally used as the pseudonoise source in spread spectrum communications.

Linear Feedback Shift Registers

Linear recurring sequences are often implemented in hardware through the use of Linear Feedback Shift Registers (LFSR). As is known in the art, an LFSR is typically implemented using either the Fibonacci (FIG. 2) or Galois (FIG. 3) model of LFSR. The Fibonacci model is characterized by the input to the first delay element being a linear combination of signal taps at various other cells in the register. The Galois model is characterized by the input to the various cells being a linear combination of the output of the last cell and the previous cell. Each of these models can produce binary sequences having a very large period and excellent pseudorandom properties. While the Fibonacci and Galois shift registers can implement the same recurrence relation, the same sequence is generated only if each is started in the appropriate initial state.

Each LFSR can be described advantageously by a companion matrix. Because LFSRs can be either right-shifting or left-shifting, a companion matrix will take one of two general forms.

$$\begin{bmatrix} C_{n-1} & \cdots & \cdots & C_1 & C_0 \\ 1 & 0 & \cdots & 0 & 0 \\ 0 & 1 & 0 & \cdots & 0 \\ \cdots & \cdots & \cdots & \cdots & \cdots \\ 0 & \cdots & \cdots & 1 & 0 \end{bmatrix} \quad \begin{bmatrix} 0 & \cdots & \cdots & 0 & A_0 \\ 1 & 0 & \cdots & 0 & A_1 \\ 0 & 1 & 0 & \cdots & \cdots \\ \cdots & \cdots & \cdots & \cdots & \cdots \\ 0 & \cdots & \cdots & 1 & A_{n-1} \end{bmatrix}$$

Left Shifting Galois (M1)    Left Shifting Fibonacci (M2)

$$\begin{bmatrix} 0 & 1 & \cdots & 0 & 0 \\ 0 & 0 & 1 & \cdots & 0 \\ 0 & \cdots & \cdots & \cdots & 0 \\ 0 & \cdots & \cdots & 0 & 1 \\ C_0 & C_1 & \cdots & \cdots & C_{n-1} \end{bmatrix} \quad \begin{bmatrix} A_{n-1} & 1 & \cdots & 0 & 0 \\ \cdots & \cdots & \cdots & \cdots & \cdots \\ \cdots & \cdots & \cdots & 0 & 1 & 0 \\ A_1 & 0 & \cdots & 0 & 1 \\ A_0 & 0 & 0 & 0 & 0 \end{bmatrix}$$

Right shifting Galois (M3)    Right Shifting Fibonacci (M4)

The general forms are differentiated by the location of a diagonal row of 1's. If the LFSR is right-shifting, the companion matrix will have a diagonal row of 1's above the main diagonal. A left-shifting LFSR has a companion matrix with a diagonal row of 1's below the main diagonal.

A companion matrix also incorporates coefficients of a polynomial. The feedback polynomial coefficients for a Fibonacci LPSR are incorporated at the rightmost column in the left-shifting companion matrix and at the leftmost column for the right-shifting companion matrix. The characteristic polynomial coefficients for a Galois LFSR are incorporated at the top row of the left-shifting companion matrix and at the bottom row of the right-shifting companion matrix. In the Fibonacci form of M2 and M4, $A_0$ is the coefficient for the oldest shift register element. A characteristic polynomial will have the form $C_n x^n + C_{n-1} x^{n-1} + \ldots + c_2 x^2 + c_1 x^7 + c_0 x^0$, while its inverse, the feedback polynomial will be of the form $a_0 x^n + a_1 x^{n-1} + \ldots + a_{n-2} x^2 + a_{n-1} x^1 + a_n x^0$, where $c_n = A_n$; $C_{n-1} = A_{n-1}$, etc.

It is well known that in order for an LFSR to have a maximal LRS period, the polynomial formed from the sequence of taps must be a primitive polynomial. A method commonly used is to choose a random polynomial and test whether it is primitive. This test is usually accomplished using a table, as useful tables of primitive polynomials have been published by many authors. period LRS consists of $2^n-1$ distinct serial patterns of n bits. (A pattern with n 0's is not used). The n bit pattern extending from each bit in the sequence is unique to the sequence. As a simple example, for n=3, the possible 3 bit combinations are 001, 010, 011, 100, 101, 110, 111. A 7 bit ($2^3-1$) maximum length sequence is: 0111010. Working around this sequence we see all possible 3 bit combinations (other than 000) as follows: 011; 111; 110; 101; 010; 100; 001.

It is advantageous to use a polynomial with a degree that is a Mersenne prime because if such a polynomial is nonfactorable, A is also primitive, which means that the LRS is maximal length. Mersenne primes are Mersenne numbers (number of the form $2^n-1$) which also happen to be prime numbers. The result of $2^3-1=7$ is prime, hence $2^3-1$ is a Mersenne prime. The result of $2^4-1=15$ is not hence $2^4-1$ is not a Mersenne prime.

Bit Error-Rate Test of Communication Channels

In order to perform rigorous testing of communication channels, pseudorandom bit patterns are generated at the transmitter. At the receiver, the received bit pattern is compared with the same pseudorandom bit sequence (generated independently at the receiver) for correctness. Because there is some communication delay between the transmitter and the receiver, some method of synchronizing the receiver pattern generator with the delayed transmitter-generated pattern is required. This is commonly done by searching the received data for a known pattern. When this pattern is found, the receiver's generator is enabled from this known state.

Searching the received data for a known pattern requires circuitry to "hunt" for specific unique patterns in the received data. "Hunting" involves additional synchronization delay because the period of the transmitted sequence may be long. With modern communications systems, the transmission occurs at much higher frequencies than the bit generation. In order to use high communication channel data rates, the sequences may also be generated in "parallel," several bits at a time.

Parallelizing Encryption

Because LFSRs are serial devices, both the Galois and Fibonacci models are speed limited by the maximum clocking/shifting rate of the circuitry involved. The clocking/shifting rate is dependent upon the signal settling time of the inputs to the registers.

Parallel LRS generation theoretically will speed up sequence generation. Multiple encryption modules operating in parallel are the cornerstone of scalable encryption with linear recurring sequences.

One of the major problems with parallelizing LRS encryption is ensuring that each encryption module is getting the proper portion of the key sequence at the correct point in the encryption or decryption of the message. This problem is addressed by a method of generating linear recurring sequences by using parallel decimated sequences as disclosed by Pierson and Witzke in *The Role of Decimated Sequences in Scaling Encryption Speeds Through Parallelism,* Conference Proceedings of the 1996 IEEE Fifteenth Annual International Phoenix Conference on Computers and Communications, Mar. 27, 1996, pp. 515–519, which is hereby incorporated by reference.

As taught by Pierson et al., companion matrices allow manipulation of linear recurring sequences using matrix arithmetic. The pattern of 1's and 0's in a LFSR define a current state vector which can be multiplied mod 2 with the companion matrix to yield the "next state" vector of the state machine; i.e., the vector that would be obtained by shifting the register once. The companion matrix also can be raised to a power k, corresponding to a "jump" in the number of states spanned by each multiplication mod 2. This exponentiated companion matrix is called a decimation matrix. As also discussed therein, decimation allows generation of a LRS by parallel means instead of serial.

The result of Pierson et al. is illustrated with the following example: assume a linear recurring sequence of states 1–33 (where each state may be one bit). A LFSR would generate them as a series over 33 cycles. This sequence can be generated much faster by two identical parallel generators A, B (k=2), where each generator outputs 4 states each cycle (x=4). As taught by Pierson et al., the x*k=eighth decimation matrix of the companion matrix for the serial generator is used to design A and B, and they output the states in only five cycles as follows:

| Cycle: | I | II | III | IV | V |
|---|---|---|---|---|---|
| Generator A: | 1–4 | 9–12 | 17–20 | 25–28 | 33–3 |
| Generator B: | 5–8 | 13–16 | 21–24 | 29–32 | 4–7 |

The parallel generators noted above which generate, in parallel, multiple bits of the same linear recurring sequence, are called Linear Recurring Sequence Generators (LRSG).

If just one 4 bit LRSG was to be utilized to generate the 33 bit LRS of the previous example, the LRSG would be designed using the fourth decimation matrix (x=4; k=1) and nine cycles would be required to generate the 33 bit LRS.

The maximum clocking rate of an LRSG is governed by the maximum number of inputs to any of its registers. More input to a register means that more layers of logic gates are required which generally results in greater propagation delay. By minimizing the number of inputs to the computation of the next state to be latched by the registers, the number of logic gates is minimized and the minimum signal settling time is achieved, thereby maximizing the permissible clocking rate. Thus it is desirable to have input circuitry that has a minimum number of inputs to any register yet still allows production of a maximal length pseudorandom sequence.

SUMMARY OF THE INVENTION

The disclosed innovations, in varying embodiments, provide one or more of the following advantages: a quick method for optimizing feedback circuits for implementing parallel generation of linear recurring sequences (LRS); a linear recurring sequence generator .(LRSG) with maximal period that is optimized for minimal feedback circuit propagation delay; a fast method for synchronizing bit error-rate testers; and a fast method for generating linear recurring sequences by parallel operation of multiple linear recurring sequence generators with feedback circuits optimized to balance minimum propagation delay against maximal sequence period.

To achieve the foregoing and other objects, and in accordance with the purpose of the present invention, as embodied and broadly described herein, the present invention may comprise a linear recurring sequence generator comprising n storage elements, each element having an input and an output, the outputs generating in parallel n bits of a linear recurring sequence. The invention further comprises a next-state generator comprising n next-state outputs, each next-state output being connected to a different one of the storage element inputs. The LSRG includes a plurality of logic gates controlling the next-state outputs, each logic gate having an input operationally connected to at least one of the storage element outputs. The connections and placement of the logic gates are a function of the nth decimation matrix of a companion matrix for a polynomial from which the linear recurring sequence would be generated in sequence, and the polynomial is selected so its companion matrix has non-zero coefficients grouped in a designated corner in order that the $k_{th}$ decimation matrix will have a maximum number of zeros.

A feedback circuit comprising XOR logic gates implements next state generation based on the decimation matrix in hardware. Sparse decimation matrices can be implemented with fewer XOR gates, and therefore a minimum propagation delay through the feedback circuit.

BRIEF DESCRIPTION OF THE DRAWINGS

The disclosed inventions will be described with reference to the accompanying drawings, which show important sample embodiments of the invention and which are incorporated in the specification hereof by reference wherein:

FIG. 1 shows a circular representation of an LRS.

FIG. 2 shows a Fibonacci model linear feedback shift register.

FIG. 3 shows a Galois model linear feedback shift register.

FIG. 4 shows a linear recurring sequence generator.

FIG. 7 shows a linear recurring sequence diagram for a 10-element LFSR and a 64-bit window.

DETAILED DESCRIPTION OF THE PREFERRED EMBODIMENTS

Figure 5:
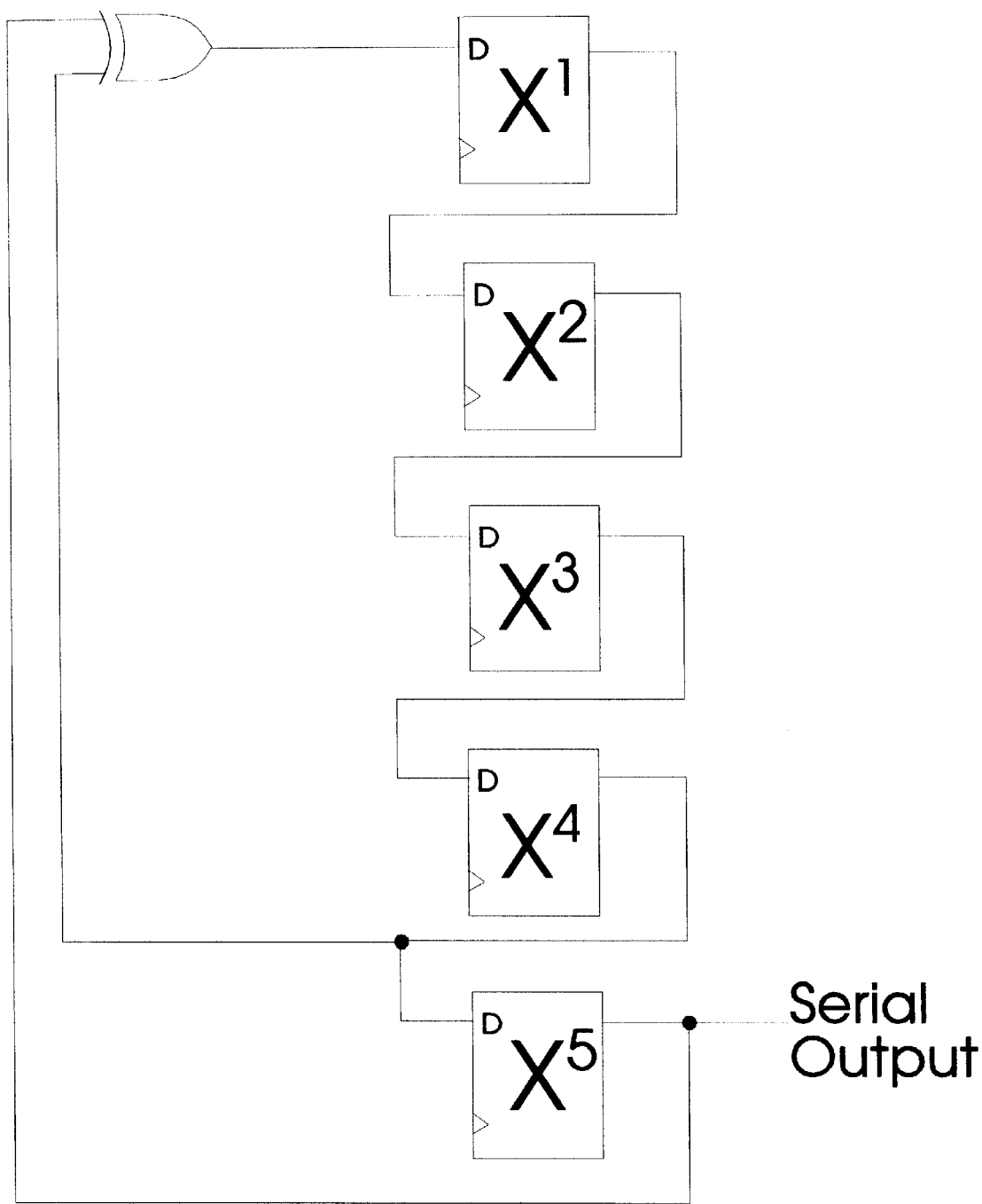
FIG. 5 shows a Fibonacci LFSR implementing a feedback polynomial of $x^5+x^4+1$.

The numerous innovative teachings of the present application will be described with particular reference to the presently preferred embodiment (by way of example, and not of limitation). However, it should be understood that this class of embodiments provides only a few examples of the many advantageous uses of the innovative teachings herein.

Linear Recurring Sequence Generator Embodiment

FIG. 4 shows a block diagram of a general form of a linear recurring sequence generator (LRSG) that is capable of outputting, in parallel, multiple bits of a linear recurring sequence (LRS). When designed with the proper decimation matrix, the LRSG can output the same LRS as a linear feedback shift register (LFSR). The emulated LFSR is preferably of the Fibonacci or Galois form although other forms may exist that may be suitable. By use of an innovative method, the LRSG feedback circuit is optimized for a maximal LRS period with minimum propagation delay.

In the embodiment shown in FIG. 4, a next-state generator circuit (feedback circuit) 920 calculates a next-state based on the present-state contained in present-state storage elements 910. The output of storage elements 910 is a segment of a linear recurring sequence. In the preferred embodiment, storage elements 910 are parallel flip-flops. Additionally, the feedback circuit 920 comprises XOR logic gates in the preferred embodiment.

Optionally, a state-to-sequence converter 930 may be necessary to ensure proper operation. State-to-sequence converter 930 typically will comprise connections between inputs and output which ensure that outputs of the device are presented in the proper order. In any given application, the need for state-to-sequence converter 930 and its construction would be obvious to one of ordinary skill in the art.

Design of the feedback circuit 920 begins with proper initial construction of a companion matrix (or equivalently, the proper choice of polynomial). From this companion matrix, decimation matrices may be determined that are optimized for fast parallel generation of linear recurring sequences.

According to this invention, if the non-zero coefficients in a companion matrix are grouped in a way to minimize the number of 1's generated when the companion matrix is exponentiated mod 2, an optimized LRS generator feedback circuit 920 can be constructed from the decimation matrix. As is known in the art, the maximal sequence period is assured by selecting a feedback polynomial from the set of primitive feedback functions. As taught herein, minimum propagation time can be insured by choosing a primitive feedback function which groups non-zero coefficients in a designated corner of the companion matrix. For ease of explanation, the following discussion may not utilize a primitive feedback function, but the teachings of the invention may be easily applied to such a function.

In accordance with this invention, for the left-shifting Fibonacci configuration, a function which groups 1's in the upper right corner of the companion matrix can be implemented with fewer logic gates than a function that has 1's distributed throughout the matrix. M5 shows a left-shifting Fibonacci companion matrix with a feedback polynomial $x^5+x^4+1$. As taught by M2, the coefficient 1's of M5 are in the right-most column. However, because these 1's are grouped near the upper right corner, as taught by the invention, this function is a good candidate for efficient parallel generation. The second, $DM^2$, fourth, $DM^4$, and fifth, $DM^5$, decimation matrices of M5, are shown at M6–M8, respectively. The relatively few one's in each column of the decimation matrices means that this function could be efficiently parallelized for every $2^{nd}$, $4^{th}$, or $5^{th}$, element.

$$DM^1 \begin{bmatrix} 0 & 0 & 0 & 0 & 1 \\ 1 & 0 & 0 & 0 & 1 \\ 0 & 1 & 0 & 0 & 0 \\ 0 & 0 & 1 & 0 & 0 \\ 0 & 0 & 0 & 1 & 0 \end{bmatrix}$$
(M5)

$$DM^2 \begin{bmatrix} 0 & 0 & 0 & 1 & 0 \\ 0 & 0 & 0 & 1 & 1 \\ 1 & 0 & 0 & 0 & 1 \\ 0 & 1 & 0 & 0 & 0 \\ 0 & 0 & 1 & 0 & 0 \end{bmatrix}$$
(M6)

$$DM^4 \begin{bmatrix} 0 & 1 & 0 & 0 & 0 \\ 0 & 1 & 1 & 0 & 0 \\ 0 & 0 & 1 & 1 & 0 \\ 0 & 0 & 0 & 1 & 1 \\ 1 & 0 & 0 & 0 & 1 \end{bmatrix}$$
(M7)

$$DM^5 \begin{bmatrix} 1 & 0 & 0 & 0 & 1 \\ 1 & 1 & 0 & 0 & 1 \\ 0 & 1 & 1 & 0 & 0 \\ 0 & 0 & 1 & 1 & 0 \\ 0 & 0 & 0 & 1 & 1 \end{bmatrix}$$
(M8)

A Fibonacci LFSR implementing the feedback polynomial $x^5+x^4+1$ of M5 is shown in FIG. 5. Note that the LFSR generates an LRS from one serial output that generates one bit each clock cycle.

Figure 6:
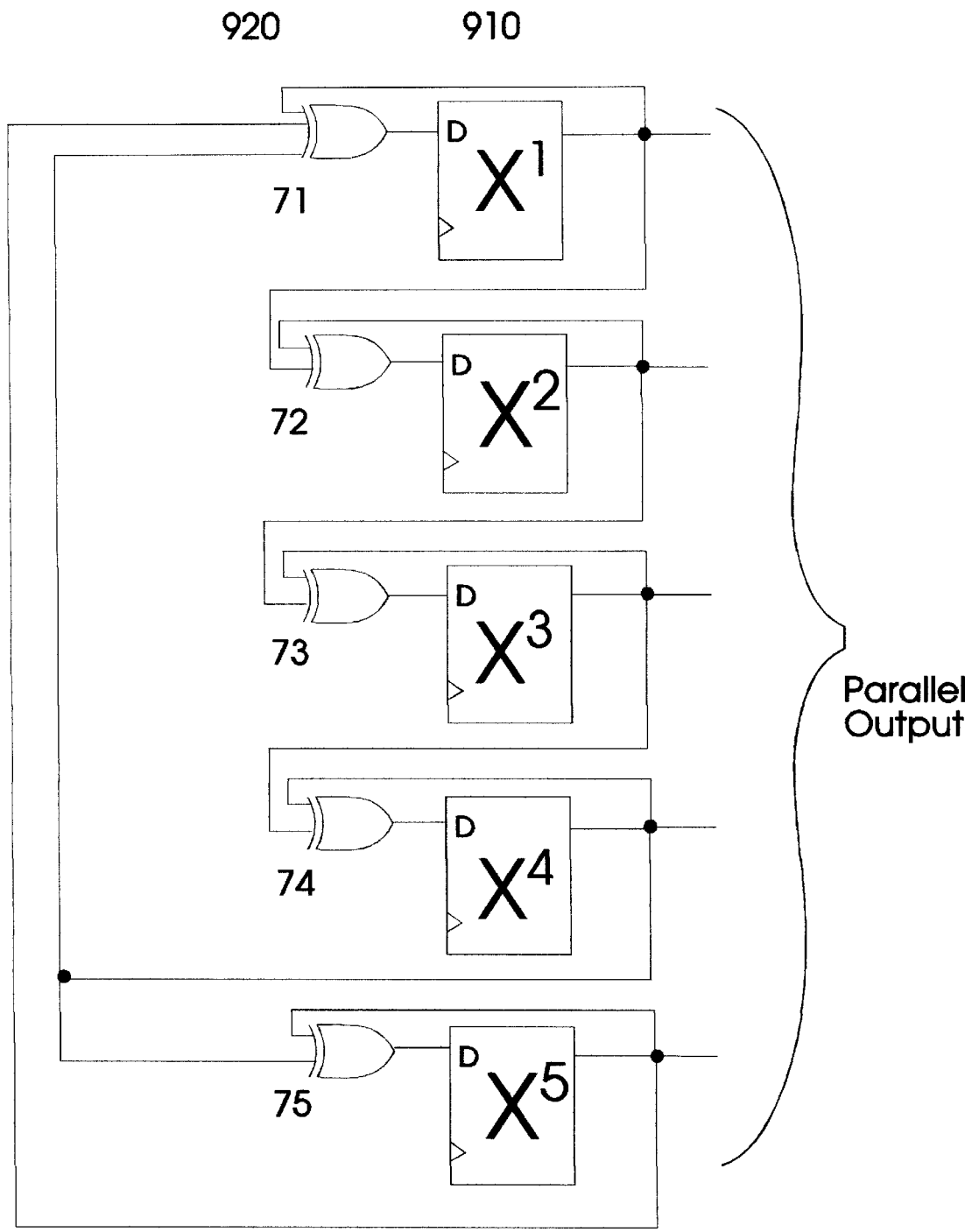
FIG. 6 shows an LRSG that generates the same LRS as the LFSR shown in FIG. 5.

FIG. 6 shows an LRSG according to the invention that generates the same LRS as the LFSR shown in FIG. 5. In this circuit, the registers $X^1$–$X^5$ form the present state storage elements 910 of FIG. 4, and the XORs 71–75 and associated connections form the next-state-generator 920. No state-to-sequence converter 930 is needed in this embodiment. Note however that the LRSG generates the LRS with a parallel output and a decimation of five. A plurality of these LRSG circuits, seeded as taught by the Pierson et al. article, will provide a parallel generation of the required LRS.

To parallelize the LRS is known; to parallelize it efficiently is part of this invention.

The fifth decimation matrix M8 is utilized to determine the connections for the five element LRSG of FIG. 6, where each column represents the output of a register, and rows containing non-zero elements in the specified column represent inputs to that register. For instance, the first column from the right represents the output of register $X^1$ and the 1's in rows 1, 4, and 5 indicate that these are the inputs to register $X^1$. As seen in FIG. 6, the XOR gate 71 at the input D of register $X^1$ has inputs from the outputs of $X^1$, $X^4$, and $X^5$. Similarly the next column from the right represents the output of register $X^2$, and it has 1's in rows 1 and 2 which correspond to the outputs from $X^1$ and $X^2$ that feed through XOR 72 to the input to $X^2$. The inputs to the remaining gates are determined in a similar fashion.

The advantage of the invention may be observed from the next example. M9 shows a left-shifting Fibonacci companion matrix with a feedback polynomial $x^5+x+1$. The coefficient 1's of $DM^1$ from this polynomial are not closely grouped near the upper right corner (one is in the lower right corner). Thus, the decimation matrices shown at M10–M12 calculated from this companion matrix have more 1's in each column than the equivalent decimation matrices (M6–M8) calculated from the companion matrix M5. As a result, the implementing circuitry for the second example will require more components and take longer to operate than the previous example.

$$DM^1 \begin{bmatrix} 0 & 0 & 0 & 0 & 1 \\ 1 & 0 & 0 & 0 & 0 \\ 0 & 1 & 0 & 0 & 0 \\ 0 & 0 & 1 & 0 & 0 \\ 0 & 0 & 0 & 1 & 1 \end{bmatrix}$$
(M9)

$$DM^2 \begin{bmatrix} 0 & 0 & 0 & 1 & 1 \\ 0 & 0 & 0 & 0 & 1 \\ 1 & 0 & 0 & 0 & 0 \\ 0 & 1 & 0 & 0 & 0 \\ 0 & 0 & 1 & 1 & 1 \end{bmatrix}$$
(M10)

$$DM^4 \begin{bmatrix} 0 & 1 & 1 & 1 & 1 \\ 0 & 0 & 1 & 1 & 1 \\ 0 & 0 & 0 & 1 & 1 \\ 0 & 0 & 0 & 0 & 1 \\ 1 & 1 & 1 & 1 & 1 \end{bmatrix}$$
(M11)

$$DM^5 \begin{bmatrix} 1 & 1 & 1 & 1 & 1 \\ 0 & 1 & 1 & 1 & 1 \\ 0 & 0 & 1 & 1 & 1 \\ 0 & 0 & 0 & 1 & 1 \\ 1 & 1 & 1 & 1 & 0 \end{bmatrix}$$
(M12)

The utility of this invention should now be apparent: the more ones that exist in a decimation matrix, the more XOR gates that will be necessary to implement that matrix In the example with the efficient function of M5, no more than 3 signals are input to any one register. If an XOR gate can only handle 2 inputs, then two levels of XOR are required to implement this function. That would require sufficient time to propagate through both XORs in succession.

However, a circuit based on the $5^{th}$ decimation matrix M12 from the function of M9 would be significantly more complicated. The input to the first register for such a circuit would XOR the outputs Of $X^2$ through $X^5$, which would require three XORs on two levels. And the input to the second register would require four XORs on three levels to input the five required signals, showing that additional ones in the decimation matrix yield additional complexity in the circuit implementation. And when one considers this invention is intended to be utilized on 64 or 128 bit functions, the amount of complexity that would arise from inefficient decimation matrixes is staggering.

In a similar manner, the left-shifting Galois configuration, a function which groups 1's in the upper right corner of the companion matrix (see M3), can be implemented with fewer logic gates than a function that has 1's in the upper left corner. In either left-shifting configuration, the number of 1's in the decimation matrices increases as the 1's in the companion matrix move away from the upper right corner. An increase in the number of 1's in the decimation matrices requires more logic gates to implement the LRS generator function.

In the right-shifting Fibonacci configuration, a function which groups 1's in the lower left corner of the companion matrix can be implemented with fewer logic gates than a function that has 1's in the upper left corner. In the right-shifting Galois configuration, a function which groups 1's in the lower left corner of the companion matrix can be implemented with fewer logic gates than a function that has 1's in the lower right corner. In either right-shifting configuration, the number of 1's in the decimation matrices increases as the 1's in the companion matrix move away from the lower left corner. An increase in the number of 1's in the decimation matrices requires more logic gates to implement the LRS generator circuit.

In a practical embodiment of the invention, a 127 bit LRSG was designed from a characteristic matrix (M13) for left shifting Fibonacci shift register with a feedback polynomial of $X^{127}+X^{126}+X^0$ (characteristic polynomial of $X^{127}+X^1+X^0$). (In the feedback polynomial, $X^n$ is the oldest element, $X^{n-1}$ is the second oldest, $X^1$ is the newest element, and $X^0$ is essentially the new bit that you are generatng.) Since $2^{127}-1$ is a Mersenne prime, and because $X^{127}+X^{126}+X^0$ is not factorable over the Galois field of 2 elements, this LRSG generates a 127 bit maximal length linear recurring sequence. The matrix (M13) is presented below in an abbreviated manner where groups of thirty consecutive 0's are indicated as (30 0's) and many lines have been deleted because the pattern is ascertainable from the remaining lines. The line numbers are indicated in the right margin of a few lines:

```
(30 0's)(30 0's)(30 0's)                        (30 0's)0000001   −127

1(30 0's)(30 0's)(30 0's)                       (30 0's)000001

01(30 0's)(30 0's)(30 0's)                      (30 0's)00000

001(30 0's)(30 0's)(30 0's)                     (30 0's)0000

0001(30 0's)(30 0's)(30 0's)                    (30 0's)000

00001(30 0's)(30 0's (30 0's)                   (30 0's)00

000001(30 0's)(30 0's (30 0's)                  (30 0's)0

0000001(30 0's)(30 0's)(30 0's)                 (30 0's)

00000001(30 0's)(30 0's)(30 0's)00000000000000000000000000000

000000001(30 0's)(30 0's)(30 0's)00000000000000000000000000000

0000000001(30 0's)(30 0's)(30 0's)00000000000000000000000000000

00000000001(30 0's)(30 0's)(30 0's)00000000000000000000000000000

000000000001(30 0's)(30 0's)(30 0's)00000000000000000000000000000

0000000000001(30 0's)(30 0's)(30 0's)00000000000000000000000000000

00000000000001(30 0's)(30 0's)(30 0's)00000000000000000000000000000   −113

(M13)

(30 0's)(30 0's)(30 0's)00000000000000000000000010000000000000000  −15

(30 0's)(30 0's)(30 0's)00000000000000000000000001000000000000000

(30 0's)(30 0's)(30 0's)00000000000000000000000000100000000000000

(30 0's)(30 0's)(30 0's)00000000000000000000000000010000000000000

(30 0's)(30 0's)(30 0's)00000000000000000000000000001000000000000

(30 0's)(30 0's)(30 0's)00000000000000000000000000000100000000000

(30 0's)(30 0's)(30 0's)00000000000000000000000000000010000000000

(30 0's)(30 0's)(30 0's)00000000000000000000000000000001000000000

(30 0's)(30 0's)(30 0's)00000000000000000000000000000000100000000

(30 0's)(30 0's)(30 0's)00000000000000000000000000000000010000000

(30 0's)(30 0's)(30 0's)                        (30 0's)1000000

(30 0's)(30 0's)(30 0's)                        (30 0's)0100000

(30 0's)(30 0's)(30 0's)                        (30 0's)0010000

(30 0's)(30 0's)(30 0's)                        (30 0's)0001000

(30 0's)(30 0's)(30 0's)                        (30 0's)0000100

(30 0's)(30 0's)(30 0's)                        (30 0's)0000010   −1
```

It is apparent that M13 groups its 1's in the upper right corner. The 64$^{th}$ decimation matrix of M13 is the characteristic matrix raised to the 64$^{th}$ power, and shown as M14:

```
(30 0's)(30 0's)0001(30 0's)                  (30 0's)000 - 127
(30 0's)(30 0's)00011(30 0's)                  (30 0's)00
(30 0's)(30 0's)000011(30 0's)                  (30 0's)0
(30 0's)(30 0's)0000011(30 0's)                   (30 0's)
(30 0's)(30 0's)00000011(30 0's)0000000000000000000000000000
(30 0's)(30 0's)000000011(30 0's)000000000000000000000000000
(30 0's)(30 0's)0000000011(30 0's)00000000000000000000000000
(30 0's)(30 0's)00000000011(30 0's)0000000000000000000000000 - 120
                                                                        (M14)
(30 0's)(30 0's)(30 0's)00000000000000000000000000001100000000
(30 0's)(30 0's)(30 0's)000000000000000000000000000000110000000
(30 0's)(30 0's)(30 0's)0000000000000000000000000000000011000000 - 70
(30 0's)(30 0's)(30 0's)                      (30 0's)1100000
(30 0's)(30 0's)(30 0's)                      (30 0's)0110000
(30 0's)(30 0's)(30 0's)                      (30 0's)0011000
(30 0's)(30 0's)(30 0's)                      (30 0's)0001100
(30 0's)(30 0's)(30 0's)                      (30 0's)0000110
(30 0's)(30 0's)(30 0's)                      (30 0's)0000011
1(30 0's)(30 0's)(30 0's)                      (30 0's)000001
01(30 0's)(30 0's)(30 0's)                      (30 0's)00000
001(30 0's)(30 0's)(30 0's)                      (30 0's)0000
0001(30 0's)(30 0's)(30 0's)                      (30 0's)000 - 60
00001(30 0's)(30 0's)(30 0's)                   (30 0's)00
000001(30 0's)(30 0's)(30 0's)                    (30 0's)0
0000001(30 0's)(30 0's)(30 0's)                    (30 0's)
00000001(30 0's)(30 0's)(30 0's)0000000000000000000000000000 - 56

(30 0's)000000000000000000000000000001(30 0's)(30 0's)00000000 - 5
(30 0's)000000000000000000000000000001(30 0's)(30 0's)0000000
(30 0's)                          (30 0's)1(30 0's)(30 0's)000000
(30 0's)                          (30 0's)01(30 0's)(30 0's)00000
(30 0's)                          (30 0's)001(30 0's)(30 0's)0000 - 1
↑                      ↑
127          . . . (columns) . . .           1
```

It is seen that all columns of matrix M14 have only one or two ones. Note, that with the decimation matrix, if you consider 1,1 to be the bottom right corner, and number the register elements from 1 to 127, you derive the equation for the new 127$^{th}$ element of the register by looking at the far left (127$^{th}$) column of the matrix. It has a 1 (non-zero element) in row 63 (counting the bottom row as 1), so the following assignments are derived for generating new register elements from the previous elements of the register:

```
REG[127] = REG[63]; (which means the input of
register 127 is connected to the output of register 63), similarly
REG[126] = REG[62];
REG[125] = REG[61];
   .
   .
   .
REG[66] = REG[2];
REG[65] = REG[1];
REG[64] = REG[127] XOR REG[126] (because column 64 -
counting from 1 at the right - has ones in both rows 127 and
rows 126 - counting from one at the bottom;

REG[63] = REG[126] XOR REG[125];
REG[62] = REG[125] XOR REG[124];
   .
   .
   .
REG[2] = REG[65] XOR REG[64];
REG[1] = REG[64] XOR REG[63];
```

Now you have generated 127 new elements of the register, stepped by 64.

(Really only 64 of the elements [elements 1 through 64] are brand new; the 63 remaining elements [elements 65 through 127] are older elements that have been shifted 64 places to the left.)

A circuit implementing the aforementioned matrix has been built using conventional programmable logic devices that are programmed in a routine manner.

Window Addressing

We define window addressing as the use of a given portion of a maximum length linear recurring sequence to determine more of the sequence with a LRSG. If the given portion is the same number of bits as there are storage elements in the LRSG, the subsequent bits in the LRS are provided by the output. Essentially, a relatively short portion of an LRS is used as an address to locate a larger "window" of the LRS.

FIG. 7 shows a linear recurring sequence diagram for a ten element (ten flip-flop) LRSG and a sixty-four bit window. The length of the LRS before repeating would be $2^{10}-1=1023$. (The maximum length LRS includes every possible combination of 10 bits except 10 zeros, for 10 zeros fed back to next-state-generator 920 would yield no change in output.) Each sixty-four-bit window can be located by a unique 10-bit address. In a preferred embodiment, six parallel LRSGs, each outputting 64 bits, would be used to output a 384 bit ATM packet.

For a Fibonacci LFSR emulation, the ten bit address is contained in the window. Thus emulating the Fibonacci form has the advantage (over Galois) that the first ten bits of the 64 bit sequence have already been calculated. This means that when reproducing the LRS of a Fibonacci LFSR, the state-to-sequence converter 930 only needs to calculate 54 bits instead of 64.

Bit Error-Rate Tester (BERT) Embodiment

Figure 8:
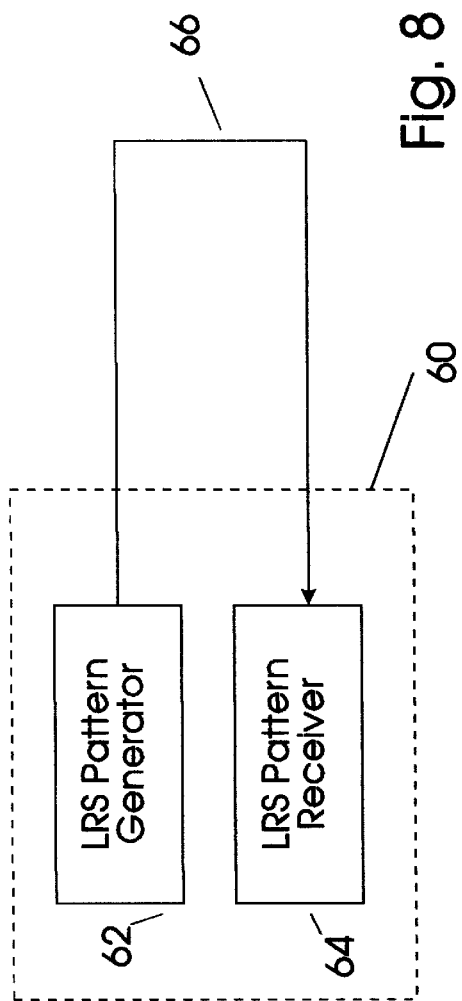
FIG. 8 shows a Bit Error Rate Tester (BERT) incorporating an LFSR optimized by the innovative method.

FIG. 8 shows a bit error-rate tester 60 for evaluating a bit error-rate on communications link 66 incorporating LRSGs for efficient synchronization. The BERT 60 in the embodiment shown includes a maximal length linear recurring sequence pattern generator 62 which may be either a serial device such as the Fibonacci or Galois models illustrated in FIGS. 2 and 3, or a parallel LRSG as described in the Pierson et al. article or this disclosure. However the LRS is generated, it is converted to a serial format and buffered for high speed transmission through communication link 66, which may be any medium. Wireless, optical, and wire are examples of such medium. An LRS pattern receiver 64 is at the other end of communication link 66. Using the window addressing system described above, pattern receiver 64 comprises a parallel LRSG for generating the same maximal LRS that was transmitted by generator 62. The received signal is converted to parallel form and the first n bits are received. If n is the degree of the polynomial from which the LRS was generated, these n bits describe a unique location within the sequence. These bits are applied to the generator in receiver 64 which causes that generator to output the next n bits of the series. These n bits are compared with the next n bits received by receiver 64. Since the transmitting and receiving generators are generating the same sequence, and the receiver is synchronized to the transmitter, any deviation in the compared signals is an indication of a communication error.

As communication test equipment is required to be produced for higher and higher speed communication channels, parallel generation of test sequences will be required. Without the use of a synchronization method easily adaptable to parallel operation, application of parallel sequence generators will be difficult. The cost advantage of this innovative method will increase as the speed of pseudorandom sequence generation/synchronization increases because parallel generation at high speed can be accomplished with less expensive hardware.

Figure 9:
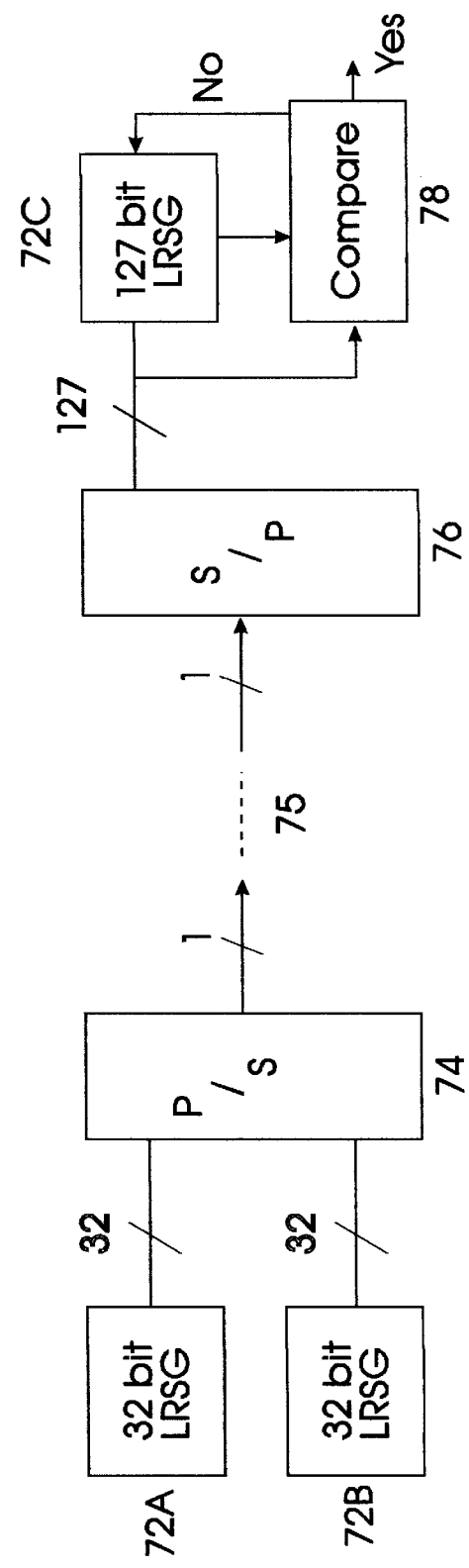
FIG. 9 shows a specific example of a BERT according to FIG. 8.

FIG. 9 shows an embodiment of the BERT of FIG. 8 to include a pair of LRSGs 72A and 72B, each derived from the $64^{th}$ decimation matrix M14. As discussed above and in the aforementioned Pierson et al article, generator 72A provides bits 1–32 on the first cycle and bits 65–96 on the second cycle, and generator 72B provides bits 33–64 on the first cycle and 97–127–1 on the second cycle (k=2 and n=). Because of the complexity of these devices, they typically operate on the order of a 20 MHz rate. Therefore, in about .05 μsecond, a unique 64 bit pattern has been generated and applied to parallel to serial converter 74 where it is transmitted along a series transmission path 75, which may be any form of conventional asynchronous data transmission that may communicate at a rate of more than 1.28 Gb/s. (As previously discussed, for the maximal length sequence, every pattern of 127 bits is unique.) After an unknown delay that is caused by the conversion rate of converter 74, and the communication rate and length of path 75, the transmitted bits are received and converted by serial to parallel converter 76 to a parallel form. The first 127 received bits are used to seed a 127 bit generator 72C that is constructed as taught by this invention. (Although generator 72C does not necessarily have to be based on a matrix having few ones as taught herein, it probably will be so designed because of the complexity that other such matrices will generate.) Once seeded, the output of generator 72C is the next 127 bits of the pseudorandom sequence that should be received. These bits are compared in comparator 78 with the next 127 bits that are received. If there are no comparison errors in these 127 bits (output YES), the probability is extremely high that the communication system is transmitting and receiving information without errors. If there is an error (output NO), a signal is applied to LRSG 72C and the sequence is repeated until the comparison is YES.

It should be understood by those skilled in the art that the embodiment of FIG. 9 does not illustrate conventional circuitry used in the invention. For example, the receiver would include a control circuit and buffers to ensure that comparator 78 is loaded with the second group of 127 received bits when generator 72C generates its output after being seeded with the first received group of 127 bits.

The window addressing method discussed above is thus seen to be particularly advantageous for the BERT. This method of synchronization does not hunt for a pattern, but "forces" synchronization based on a presumption of correctly receiving n bits of data, where n is the degree of the polynomial used to generate the linear recurring sequence used as the pseudorandom data by the transmitter. If only one LRSG is used that is designed from the $n^{th}$ decimation matrix (k=1), then the first n bits of the sequence that are received will generate, in parallel, the next n bits of the sequence. These bits may be compared with the bits actually received to see if the communication line is working. If bits are being received without errors, only 2n bit times are required to be assured of synchronization. In addition, any consecutive 2n bits are sufficient for synchronization, allowing a parallel generator to be loaded with received bits from any boundary, not requiring any bitwise "hunt" to achieve alignment of "parallel words."

In an alternate embodiment, the pattern generator 62 and pattern receiver/checker 64 can be physically separate units. This alternate embodiment allows testing of communications media without routing the test signal back to the same physical location as the pattern generator 62. For example, when testing an installed optical fiber link it may be desirable to have the pattern generator 62 at one end of the link and the pattern receiver/checker 64 at the other end of the link.

This method can be applied by all commercial vendors of communication test equipment. It may be applicable to the synchronization of other communication processes as well.

Software Embodiment

Figure 10:
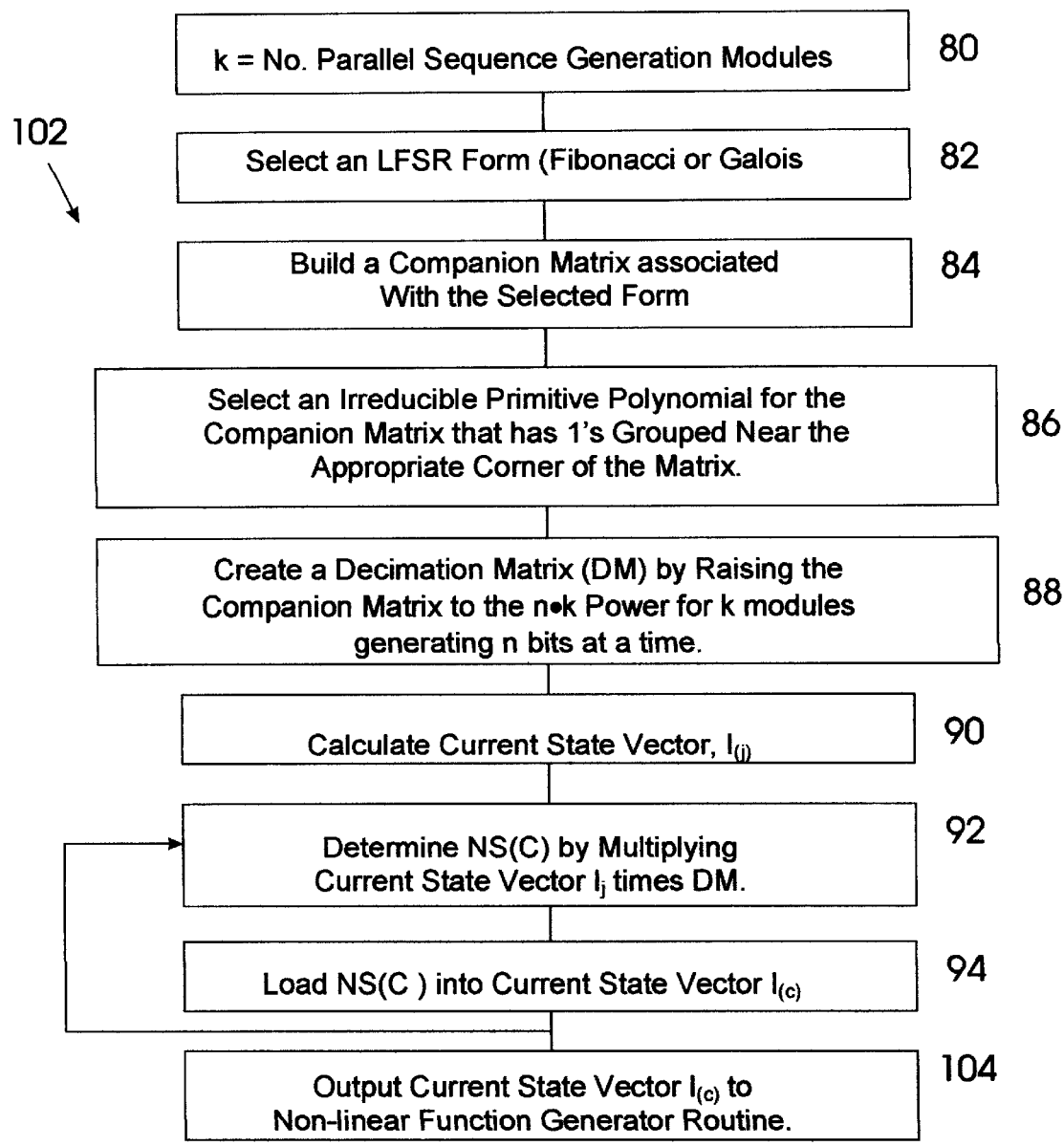
FIG. 10 shows a flow chart of a software implementation of the innovative method for minimizing propagation delay of a maximal sequence period linear feedback shift register.

FIG. 10 shows a software program flowchart for implementation of the innovative method for minimizing propagation delay of a maximal sequence period linear recurring sequence generator. For k parallel sequence generation modules 80, select a linear feedback shift register form from the group consisting of Fibonacci and Galois 82. Build a companion matrix associated with the selected form 84. Complete the companion matrix by selecting an irreducible primitive polynomial for the companion matrix such that the 1's are grouped in the upper right-hand corner of the matrix 86. Create a decimation matrix by raising the companion matrix to the n·k power for K modules, each generating n bits at a time 88. To initialize the operation of the parallel modules, each must be seeded with an initial start vector of n bits corresponding to the rank of the encryption module in the unit 90, e.g., the first module is seeded with the first vector in the linear recurring sequence, the second module is seeded with the second vector, and so on until the $k^{th}$ module is seeded with the $k^{th}$ vector. At this point in the program, a sparse decimation matrix has been created and the initial vectors have been loaded into each module. The initial state vector is now the current state vector of the LFSR. The non-zero elements of the decimation matrix are XORed with appropriate elements of the current state vector, I, to calculate the elements of the next state vector, NS. Using Boolean reduction to eliminate the AND operations and using recursion to implement the XOR operations yields a simplified routine 92 for calculation of NS. After the next state vector is calculated, it is loaded into the current state vector, I, 94. For an encryptor, the new current state vector is output to the nonlinear function generator routine 96 and the program continues to loop through 92, 94 and 96.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. In particular, linear recurring sequences may be of any number base and are not restricted to binary sequences, LFSRs (and LRSGs) are not restricted to binary logic elements, and feedback polynomials, companion matrices, and decimation matrices are not restricted to binary elements and coefficients. Note that mod 2 matrix and vector operations are used for binary LRS and LRSG. Operations in other bases still will group the non-zero coefficients in an appropriate corner of a companion matrix but will require the appropriate modulo arithmetic for decimation and next state vector calculation.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

What is claimed is:

1. A bit error rate tester comprising:

a communication path;

means for transmitting a linear recurring sequence serially along said communication path, the sequence being derived from an n-degree polynomial;

a receiver for receiving the transmitted sequence comprising:

a linear recurring sequence generator for generating the same sequence being transmitted to the receiver, said generator being synchronized to the transmitted sequence by being seeded by any n received bits of the transmitted sequence and generating as an output the next n bits of the sequence; and means for comparing the output of said generator with the next n received bits of the transmitted sequence.

2. The bit error rate tester of claim 1 wherein said receiver further comprises a serial to parallel converter having an input connected to said communication path for receiving the serially transmitted sequence and an output providing said sequence on parallel paths to said linear recurring sequence generator and said means for comparing.

3. The bit error rate tester of claim 2 wherein the degree of said polynomial is a Mersenne prime.

4. The bit error rate tester of claim 1 wherein said linear recurring sequence generator comprises:

n storage elements, each element having an input and an output, said outputs generating in parallel n bits of a linear recurring sequence; and a next-state generator comprising n next-state outputs, each next-state output being connected to a different one of said storage element inputs; said generator including a plurality of logic gates controlling said next-state outputs, each logic gate having an input operationally connected to at least one of said storage element outputs; the connections and placement of said logic gates being a function of the $n^{th}$ decimation matrix of a companion matrix for a polynomial from which the linear recurring sequence would be generated;

the polynomial being selected so its companion matrix has non-zero coefficients grouped in a designated corner in order that the $k^{th}$ decimation matrix will have a maximum number of zeros.

5. The bit error rate tester of claim 1 wherein said means for transmitting comprises:

k linear recurring sequence generators operating in parallel, each of said generators providing at an output x bits of said sequence, where x*k is less than or equal to n; and a parallel to series converter receiving as parallel inputs the output of each of said k generators and providing a serial output to said communication path.

6. The bit error rate tester of claim 1 wherein said LRS is a maximal length sequence.

* * * * *